United States Patent [19]

Killion

[11] Patent Number: 4,461,571
[45] Date of Patent: Jul. 24, 1984

[54] TEST SYSTEM FOR WAVE GUIDE ARC DETECTOR CIRCUITS

[75] Inventor: Richard H. Killion, Cockeysville, Md.

[73] Assignee: Westinghouse Electric Corp., Pittsburgh, Pa.

[21] Appl. No.: 375,250

[22] Filed: May 5, 1982

[51] Int. Cl.³ .......................................... G01N 21/00
[52] U.S. Cl. .................................. 356/256; 250/554; 333/248; 361/1
[58] Field of Search ..................... 356/256; 333/248; 361/1; 250/206, 554

[56] References Cited

U.S. PATENT DOCUMENTS

| | | | |
|---|---|---|---|
| 3,161,863 | 12/1964 | Deziel | 250/554 X |
| 3,191,046 | 6/1965 | Savalli | 250/227 X |
| 3,519,354 | 7/1970 | Brown, Jr. et al. | 356/342 |
| 4,115,828 | 9/1978 | Rowe et al. | 361/1 |
| 4,381,455 | 4/1983 | Komori | 250/554 |

Primary Examiner—William L. Sikes
Assistant Examiner—Matthew W. Koren
Attorney, Agent, or Firm—J. B. Hinson

[57] ABSTRACT

A system for testing a wave guide arc detecting circuit for a microwave system is disclosed. Testing is accomplished by utilizing a pulsed laser source to generate pulses of optical energy which are used to simulate an electrical arc across the wave guide. The laser source is then positioned such that the pulsed output signal impinges upon the wave guide arc detector circuit to be tested. This is most advantageously accomplished by affixing the wave guide arc detector circuit to the wave guide in a fashion similar to normal operation. This enables the arc detecting circuit to view the end of the wave guide through the interior of the wave guide. The laser source is positioned such that the output pulse of the laser source impinges on the open end of the wave guide. The operational status of the wave guide arc detecting circuit is determined by measuring the elapsed time between the generation of the output pulse of the laser and the detection of the pulse by the arc detecting circuit being tested.

6 Claims, 5 Drawing Figures

TEST SYSTEM FOR WAVE GUIDE ARC DETECTOR CIRCUITS

GOVERNMENT CONTRACT

This invention was first conceived or reduced to practice under Contract No. F33657-75-C-031 with the U.S. Air Force.

BACKGROUND OF THE INVENTION

1. Field of the Invention

The invention relates to test systems and more specifically, to test systems for testing wave-guide arc detection circuits.

2. Summary of the Prior Art

Testing wave guide arc detector circuits is difficult due to the complexity of generating an arc across a wave guide using pulses of microwave energy under controlled conditions. Among the complexities associated with this method are uncertainties associated with accurately determining the leading edge of the arc and controlling the energy level of the arc. These difficulties have resulted in all prior art efforts to test such method being relatively inconsistent.

SUMMARY OF THE INVENTION

The disclosed invention provides apparatus and a convenient method for testing wave guide arc detector circuits utilizing pulsed light source as a simulated arc. A pulse generator circuit is utilized to provide an electrical pulse which is coupled as a trigger to a laser diode light source to generate a pulse of optical energy. The leading edge of the pulse of optical energy is detected by measuring the current through the laser diode source and assuming that the pulse of optical energy is substantially coincident with the leading edge of the current through the laser diode. The laser diode output pulse is coupled to a section of wave guide such that it impinges on an open end of the wave guide. The arc detector circuit to be tested is coupled to view the output pulse of the laser diode through a small opening in the outer wall of the wave guide. If the wave guide arc detection circuit is operable a signal indicating the detection of the output pulse of the laser is generated by the wave guide arc detector circuit. An interval timer determines the time interval between the leading edge of the output pulse of the laser and the output signal of the detector to determine if the operation of the wave guide arc detection circuit is acceptable.

DETAILED DESCRIPTION

Figure 1:
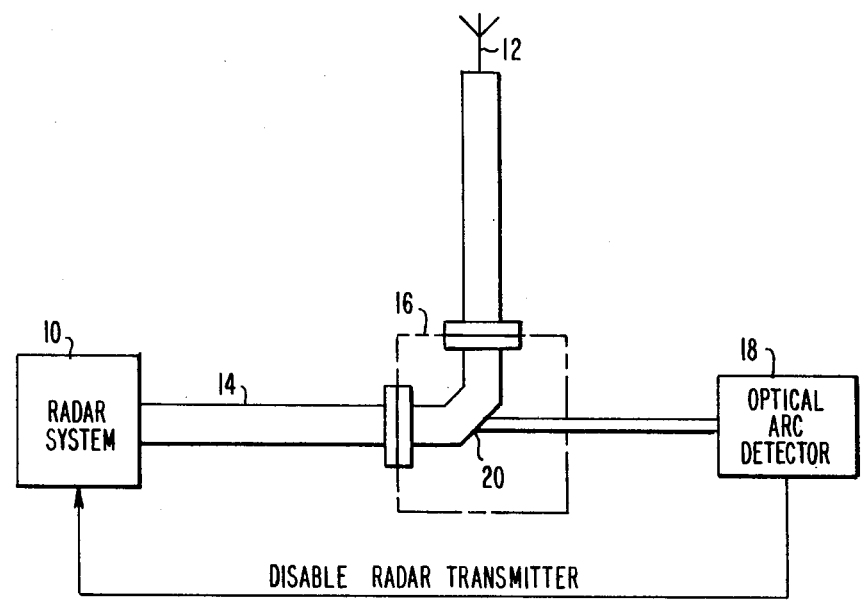
FIG. 1 is a functional block diagram of a typical radar system illustrating the use of an optical wave guide arc detector circuit.

FIG. 1 is a block diagram illustrating the use of optical wave guide arc detector circuits to protect a radar system. A conventional radar system 10 is coupled to an antenna 12 through a wave guide 14. The wave guide 14 includes a coupling section 16 which may be conveniently a 90° coupling section permitting the optical wave guide arc detector circuit 18 to view the interior of the wave guide 14 in a direction toward the radar system 10. This capability is conveniently provided by having a small opening 20 in the exterior wall portion of the coupling section 16 which is approximately 45° with respect to the line of sight toward the radar transmitter 10. This is a convenient arrangement because most arcs in the wave guide (between adjacent interior walls) either develop near the trasmitter 10 or very rapidly migrate to this point. Additionally, the arcs are most critical in radar systems utilizing traveling wave tubes because the arc can destroy the coupling window isolating the interior of the traveling wave tube from the wave guide. In the system illustrated in FIG. 1 it is assumed that if the system does utilize a traveling wave tube that the optical arc detector 18 will have a clear view of the coupling window through the wave guide 14. Arcing across the wave guide 14 between the transmitter 10 and the opening 20 will be detected by the optical arc detection 18 causing this circuit to generate a disable signal which turns off the radar system 10 thereby extinguishing the arc.

Figure 2:
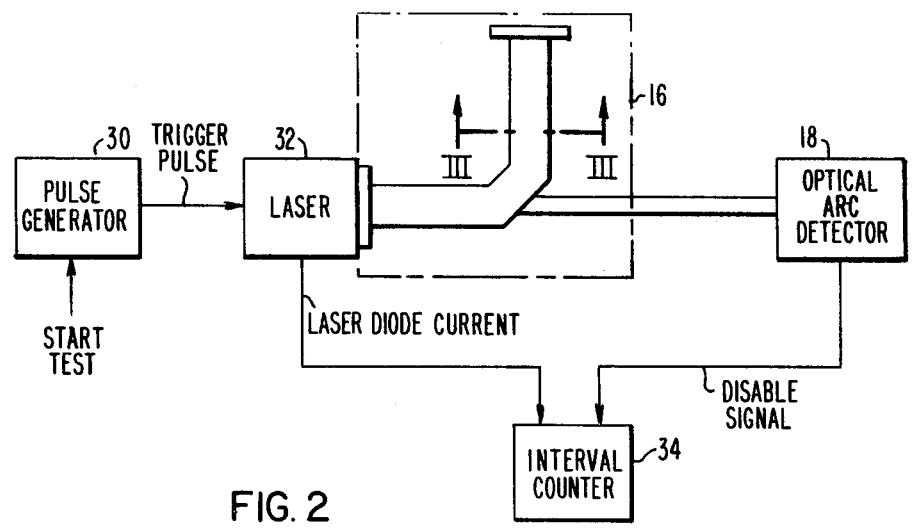
FIG. 2 is a schematic diagram of the preferred embodiment of the invention illustrating of the use of the invention to test a wave guide arc detection circuit.

FIG. 2 illustrates the preferred embodiment of the invention. To initiate a test of the optical arc detector circuit 18, a start test signal is coupled to a pulse generator 30. In response to this signal, the pulse generator 30 generates a single trigger pulse which is coupled to a laser 32 to generate a pulse of optical energy preferably, in the general power range of 3 watts. This pulse of optical energy is used to simulate an arc in the wave guide. (The laser 32 includes a diode laser and the associated drive circuitry, as described in more detail later.)

The coupling section of wave guide 16 is affixed to the laser 32 such that the pulse of optical energy from the laser 32 impinges on the open end of the coupling section of wave guide 16. The optical arc detector circuit 18 has a substantially unobstructed view of the output pulse of the laser 32 through the coupling section 16. When the optical arc detector circuit 18 detects the output pulse of the laser 32, an electrical output disable signal is generated. The laser 32 also includes a circuit which detects the current flowing through the laser diode to produce an electrical signal substantially coincident with the optical output pulse of the laser 32. The output (disable signal) of the optical arc detector circuit 18 and the diode current signal from the laser 32 are coupled to an interval counter 34 to determine the delay between the simulated arc and its detection. Proper operation of the arc detection circuit 18 is indicated by this delay being within acceptable limits. Each trigger pulse results in a complete test of the optical arc detector circuit 18.

In the experimental model, the laser 32 was designed to generate a light pulse having a selectable power level between 1 and 10 watts with a duration not greater than 0.30 microseconds in response to each trigger pulse. In practice, the delay between the optical output pulse of the laser 32 and the current to the laser diode forming a part of the laser 32 is in the order of 1 nanosecond with the wave length of the laser diode being in the order of 900 micrometers. In the current state of the art, it is desired that the optical arc detector 18 detect wave guide arcs within a few microseconds of their origin. This being the case, the delay between the optical output of the laser 32 and the current to the laser diode can be ignored and the assumption made that for test purposes the current through the laser diode is coincident with the optical output pulse.

Figure 3:
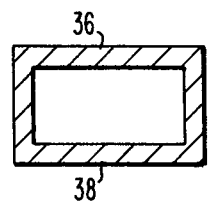
FIG. 3 is a cross section diagram of a typical rectangular wave guide.

For a better understanding of the wave guide, a cross section of the coupling section 16 along lines III—III is illustrated in FIG. 3. Typically the cross section of the wave guide 14 is uniform along its entire length. As can be seen, the cross section of the wave-guide is rectangular with the inner wall forming a rectangular interior portion. Arcs normally develop between the interior of the two longer walls 36 and 38.

Figure 4:
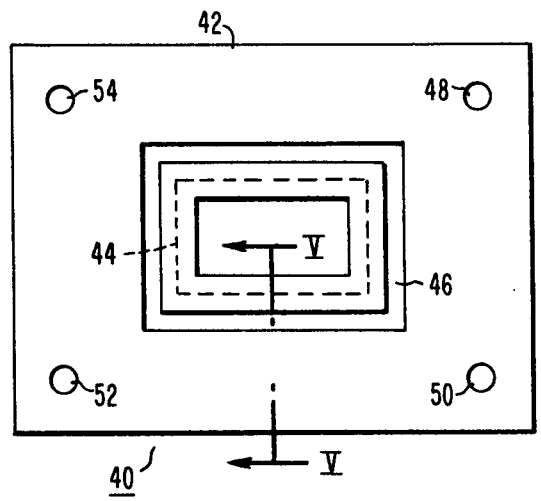
FIG. 4 is an end view of a section of wave guide including a coupling flange.
Figure 5:
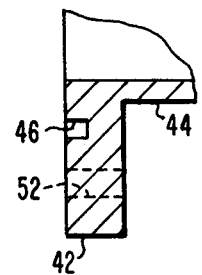
FIG. 5 is a fragmentary edge view of the wave-guide coupling section illustrated in FIG. 4.

Typically, the wave guide is a highly conductive metal with polished inner surfaces with adjoining sections of the wave guide bolted together with flanges. This is further illustrated in FIG. 4 by the end view of the coupling section 16. As can be seen, the coupling section 16 includes a flange portion 42 whose outer edges extend beyond the outer walls 44 of the wave guide section. Included in the surface of the flange is a small groove 46 for a suitable gasket so that when adjoining sections can be suitably coupled together using bolts as fasteners through holes 48, 50, 52 and 54, such that the interior of the wave guide is protected from environmental contamination. Additionally, the flange 42 may include a choke groove (not illustrated). In normal operation a flange of the type illustrated in FIG. 4 forms the end portion of coupling section 16 and for test purposes is bolted to a complementally flat mating surface which is affixed to laser 32. The optical arc detector circuit 18 is secured to the coupling section 16 in its normal position and is provided with a suitable power source to permit it to operate normally. Testing of the arc detection circuit 18 is then initiated, as described above.

Typically, the sensor utilized in the arc detector circuit 18 is a photodiode having a spectral response ranging from 350 to 1150 nanometers. This spectral response includes the wavelength of the output of the laser 32. Any arc detector circuit having a sensitivity and spectral response compatible with the laser 32 can be tested.

In the experimental model, the laser 32 was comprised of a commercial laser diode pulser type No. IL30C300P8 manufactured by Power Technology, Inc. driving a laser diode type No. SC2007A manufactured by RCA. The pulse generator circuit 30 may be any type of circuit generating a digital output with a duration not being critical in that the commercial laser diode pulse driver includes circuitry to limit the output pulse of the laser diode to approximately 0.3 microseconds. Interval counter 34 can conveniently be any of a number of commercial devices capable of measuring the time interval between two electrical signals, i.e. the laser diode current signal and the disable signal.

Currently, laser diode sources are commercially available for a generating peak power outputs in the range of 1 to 300 watts with the laser described above being adjustable between one and ten watts. The higher power laser sources are suitable for use in the disclosed system if the higher output is required or desired. Additionally, should the requirements require the light (optical) pulses have a longer duration, it is visualized that Xenon flash tubes might be used instead of the laser sources.

I claim:

1. Apparatus for testing a wave guide arc detecting circuit comprising:
    (a) a section of wave guide;
    (b) a source for generating a simulated arc comprising a pulse of optical energy in response to a trigger signal;
    (c) means for coupling said simulated arc to said section of rectangular wave guide;
    (d) means for coupling said arc detecting circuit to said section of wave guide such that the optical path between said simulated arc and said arc detecting circuit is substantially unobstructed.

2. Apparatus in accordance with claim 1 wherein said wave guide includes an elbow with said wave guide arc detecting circuit affixed adjacent said elbow to view said simulated arc through the interior of said wave guide.

3. Apparatus in accordance with claim 1 wherein said elbow includes an outer wall having flat portions inclined at an angle of 45° to said wave guide which includes an opening therein through which said wave guide arc detecting circuit views the interior of said wave guide.

4. A method of testing a wave guide arc detecting circuit, comprising the steps of:
    (a) operating a source of optical energy in a pulse mode to generate at least a pulse of optical energy having a wavelength within the response spectrum of said wave guide arc detecting circuit;
    (b) positioning said source of optical energy such that said pulse of optical energy impinges on an open end of a wave guide;
    (c) positioning said wave guide arc detecting circuit to view said pulse of optical energy through the interior of said wave guide; and
    (d) measuring the time interval between a said pulse of said optical energy and detection of said pulse of optical energy by said wave guide arc detecting circuit.

5. The method of testing a wave guide arc detecting circuit in accordance with claim 4 wherein said source of a pulse of optical energy is a laser selected to generate a pulse of optical energy which has a wavelength within the response spectrum of said wave guide arc detecting circuit.

6. The method of testing a wave guide arc detecting circuit in accordance with claim 5 wherein said laser is a solid state laser diode.

* * * * *